(12) United States Patent
Kodama (10) Patent No.: US 9,070,819 B2
(45) Date of Patent: Jun. 30, 2015

(54) METHOD FOR MANUFACTURING THIN FILM COMPOUND SOLAR CELL

(71) Applicant: Sharp Kabushiki Kaisha, Osaka-shi, Osaka (JP)

(72) Inventor: Tomoya Kodama, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/060,985

(22) Filed: Oct. 23, 2013

(65) Prior Publication Data

US 2014/0051205 A1    Feb. 20, 2014

Related U.S. Application Data (62) Division of application No. 13/202,678, filed as application No. PCT/JP2010/052655 on Feb. 22, 2010, now abandoned.

(30) Foreign Application Priority Data

Feb. 26, 2009  (JP) .................................. 2009-044415

(51) Int. Cl.
*H01L 21/00*       (2006.01)
*H01L 31/18*       (2006.01)
*H01L 31/0392*   (2006.01)
(Continued)

(52) U.S. Cl.
CPC ............ *H01L 31/18* (2013.01); *H01L 31/0392* (2013.01); *H01L 31/048* (2013.01); *H01L 31/0693* (2013.01); *H01L 31/1892* (2013.01); *Y02E 10/544* (2013.01)

(58) Field of Classification Search
None
See application file for complete search history.

(56) References Cited

U.S. PATENT DOCUMENTS

| 4,370,510 A | 1/1983 | Stirn |
| 4,392,297 A | 7/1983 | Little |
| 4,514,579 A | 4/1985 | Hanak |

(Continued)

FOREIGN PATENT DOCUMENTS

| EP | 1 939 945 A2 | 7/2008 |
| JP | 08107281 A  * | 4/1996 |

(Continued)

OTHER PUBLICATIONS

International Search Report for PCT/JP2010/052655, mailed Mar. 16, 2010.

(Continued)

*Primary Examiner* — Eli Mekhlin
(74) *Attorney, Agent, or Firm* — Nixon & Vanderhye P.C.

(57) ABSTRACT

To manufacture a thin film compound solar cell which can improve the adhesive property of electrodes even when being provided with a base material, and which prevents the base material from being separated. A cell main body configured by laminating a plurality of compound semiconductor layers is formed on a substrate. A rear surface electrode 7 is formed on the cell main body, and a rear surface film 8 as the base material is formed on the rear surface electrode 7. A reinforcing material 9 is attached on the rear surface film 8. The substrate is separated from the cell main body, and the cell main body is mesa-etched. A surface electrode 13 is formed on a contact layer 3 after the etching. The reinforcing material 9 is separated, and the surface electrode 13 is annealed. The formed thin film compound solar cell is separated into a plurality of solar cell elements.

5 Claims, 5 Drawing Sheets

(51) Int. Cl.
*H01L 31/048* (2014.01)
*H01L 31/0693* (2012.01)

(56) References Cited

U.S. PATENT DOCUMENTS

| | | | | |
|---|---|---|---|---|
| 4,681,654 | A | * | 7/1987 | Clementi et al. ............... 216/18 |
| 5,538,902 | A | | 7/1996 | Izu et al. |
| 6,100,166 | A | * | 8/2000 | Sakaguchi et al. ............ 438/455 |
| 6,410,362 | B1 | | 6/2002 | Simburger et al. |
| 6,444,897 | B1 | * | 9/2002 | Luque-Lopez et al. ....... 136/255 |
| 2006/0144435 | A1 | | 7/2006 | Wanlass |
| 2007/0277873 | A1 | * | 12/2007 | Cornfeld et al. .............. 136/255 |
| 2008/0223436 | A1 | | 9/2008 | den Boer et al. |
| 2008/0245409 | A1 | * | 10/2008 | Varghese et al. ............. 136/256 |
| 2009/0020149 | A1 | | 1/2009 | Woods et al. |
| 2010/0200063 | A1 | | 8/2010 | Djeu |

FOREIGN PATENT DOCUMENTS

| | | |
|---|---|---|
| JP | 2002-289884 | 10/2002 |
| JP | 2004-327889 | 11/2004 |
| JP | 2007-317834 A | 12/2007 |
| JP | 2008-270604 | 11/2008 |

OTHER PUBLICATIONS

Wanlass, M. W. et al., "Lattice-Mismatched Approaches for High-Performance, III-V Photovoltaic Energy Converters," IEEE, 2005.
Wanlass, M. W., et al., "Monolithic, Ultra-Thin GaInP/GaAs/GaInAs Tandem Solar Cells," IEEE, 2006.

* cited by examiner

FIG. 1
PROCESS 1

FIG. 5
PROCESS 5

FIG. 2
PROCESS 2

FIG. 6
PROCESS 6

FIG. 3
PROCESS 3

FIG. 7
PROCESS 7

FIG. 4
PROCESS 4

FIG. 8
PROCESS 8

FIG. 9
PROCESS 9

FIG. 13
PROCESS 13

FIG. 10
PROCESS 10

FIG. 14
PROCESS 14

FIG. 11
PROCESS 11

FI. 15
PROCESS 15

FIG. 12
PROCESS 12

FIG. 16
PROCESS 16

ure 350° C. in order to reduce the component of
METHOD FOR MANUFACTURING THIN FILM COMPOUND SOLAR CELL

CROSS REFERENCE TO RELATED APPLICATIONS

This application is a divisional of U.S. application Ser. No. 13/202,678, filed Aug. 22, 2011, which is the U.S. national phase of International Application No. PCT/JP2010/052655, filed Feb. 22, 2010, which designated the U.S. and claims priority to Japanese Application No. 2009-044415, filed Feb. 26, 2009, the entire contents of each of which are hereby incorporated by reference.

TECHNICAL FIELD

The present invention relates to a method for manufacturing a thin film compound solar cell having a cell main body in which at least one PN junction is formed by a plurality of compound semiconductor layers, each having a different chemical composition.

BACKGROUND ART

A conventional thin film compound solar cell is configured such that a surface electrode is provided on a light receiving surface of a cell main body formed by laminating a plurality of compound semiconductor layers, and such that a rear surface electrode is provided on the surface opposite to the light receiving surface of the cell main body.

Figure 24:
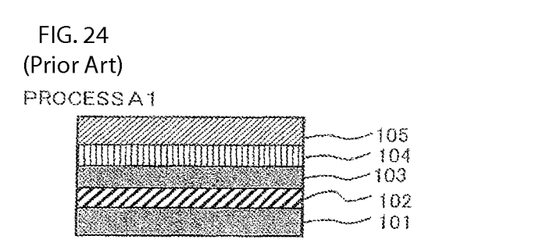
FIG. 24 is a cross-sectional view of the thin film compound solar cell when a cell main body is formed in a conventional manufacturing method.

The thin film compound solar cell is manufactured as follows. In process A1 shown in FIG. 24, an etching-stop layer 102, a base layer 103, an emitter layer 104, and a contact layer 105 respectively formed by compound semiconductor layers are laminated in this order on a substrate 101, so that a cell main body is formed.

Figure 25:
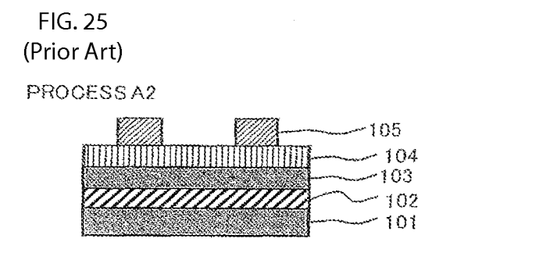
FIG. 25 is a cross-sectional view of the thin film compound solar cell when a contact layer is etched.

In process A2 shown in FIG. 25, a protective film, such as a photoresist, is applied on the surface of the contact layer 105, and the region of the protective film, which region is patterned by exposure, is etched. The contact layer 105 is patterned by contact layer etching. The applied resist is removed after the completion of the patterning. Next, a photoresist is again applied for formation of a surface electrode, and a protective film is formed.

Figure 26:
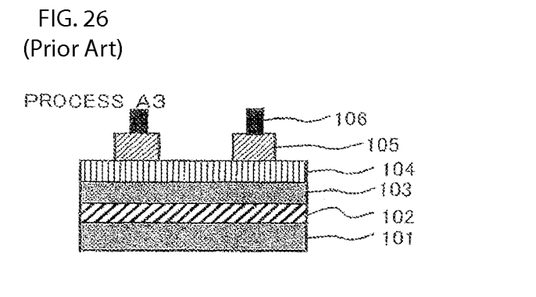
FIG. 26 is a cross-sectional view of the thin film compound solar cell when a surface electrode is formed.

In process A3 shown in FIG. 26, a protective film opening section is formed by patterning the photoresist by exposure so that the protective film opening section is included in the region of the contact layer 105 formed by the preceding process. After a surface electrode is laminated, the photoresist is removed, so that a surface electrode 106 is selectively formed only in the protective film opening section. By this surface electrode forming process, the region of the surface electrode can be patterned so as to be included in the region of the contact layer formed by the preceding process.

After the completion of the patterning of the surface electrode 106, the surface electrode 106 is annealed at a temperature of about 350° C. in order to reduce the component of contact resistance between the surface electrode 106 and the contact layer 105 and to increase the adhesive force between the surface electrode 106 and the contact layer 105.

Figure 27:
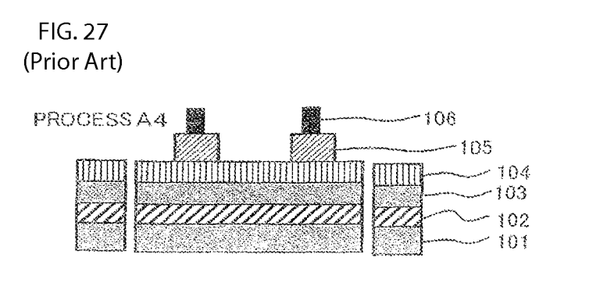
FIG. 27 is a cross-sectional view of the thin film compound solar cell when the cell is separated into solar cell elements.

In process A4 shown in FIG. 27, the protective film is patterned by exposure so as to define a cell formation region corresponding to a predetermined shape (chip shape) of a solar cell element. A protective film opening section is formed, so that the opening section is mesa-etched. Then, the solar cell element having the predetermined shape (chip shape) is separated by mechanical means, such as dicing.

Figure 28:
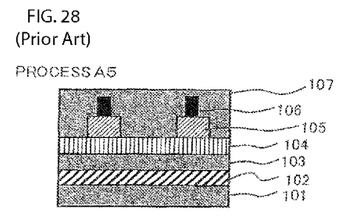
FIG. 28 is a cross-sectional view of the thin film compound solar cell when a surface film is formed.

In process A5 shown in FIG. 28, a transparent resin, such as silicone resin, is applied to the side of the light receiving surface of the solar cell element, so that a transparent surface film 107 is bonded onto the transparent resin. Thereby, the thin film compound solar cell and the surface film 107 are bonded to each other via the resin, so that the surface film 107 serves as a base material of the thin film compound solar cell.

Figure 29:
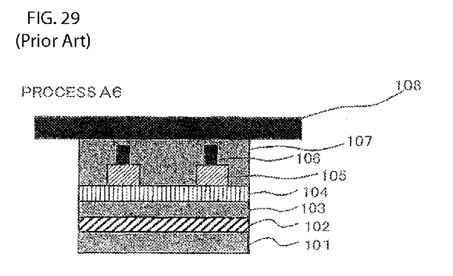
FIG. 29 is a cross-sectional view of the thin film compound solar cell when a reinforcing material is attached.

In process A6 shown in FIG. 29, a reinforcing material 108, such as glass or sapphire, is bonded via wax on the side of the light receiving surface of the solar cell element, to which side the surface film 107 is bonded.

Figure 30:
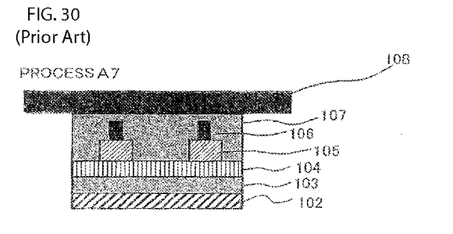
FIG. 30 is a cross-sectional view of the thin film compound solar cell when a substrate is removed.

In process A7 shown in FIG. 30, the solar cell element, to which the reinforcing material 108 is bonded, is immersed in an etchant. Since the etching is stopped at the etching-stop layer 102, only the substrate 101 can be removed so that only the cell main body is left. Thereby, the substrate 101 is separated from the compound semiconductor layers, so that the solar cell element exhibits its flexibility.

Figure 31:
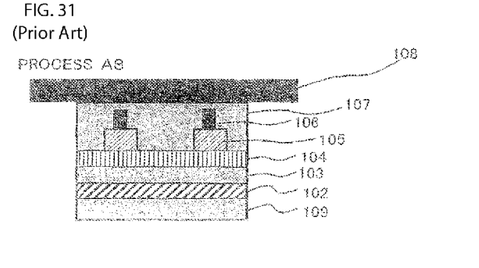
FIG. 31 is a cross-sectional view of the thin film compound solar cell when a rear surface electrode is formed.

In process A8 shown in FIG. 31, an electrode material is vapor-deposited on the exposed rear surface of the compound semiconductor layer, so that a rear surface electrode 109 is formed.

Figure 32:
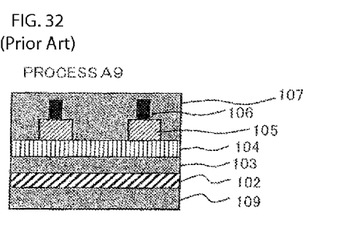
FIG. 32 is a cross-sectional view of the thin film compound solar cell when the reinforcing material is separated.

In process A9 shown in FIG. 32, the wax bonding the reinforcing material 108 to the solar cell element is finally is dissolved by an organic solvent, such as acetone, so that the reinforcing material 108 is removed from the solar cell element.

The thin film compound solar cell manufactured as described above has the structure in which the surface film as the base material is bonded to the light receiving surface of the cell main body with a PN junction formed therein.

Meanwhile, the surface film is bonded on the side of the light receiving surface, and hence high transparency is required for the surface film so as to prevent the conversion efficiency of the solar cell element from being impaired. The high transparency film generally has low temperature resistance. In the conventional method for manufacturing the thin film compound solar cell, the process is performed such that, after the surface film is bonded to the solar cell element, the substrate is removed and the rear surface electrode is formed. After the formation of the rear surface electrode, it is necessary to anneal the rear surface electrode in order to reduce the component of contact resistance between the rear surface electrode and the compound semiconductor layer, and in order to increase the adhesive force between the rear surface electrode and the compound semiconductor layer. The annealing temperature is higher than the heat-resistant temperature of the surface film, and hence the rear surface electrode cannot be annealed in the state where the surface film is bonded to the solar cell element. Therefore, there is a problem that the rear surface electrode is separated from the compound semiconductor layer.

Further, when the wax used to bond the solar cell element to the reinforcing material is dissolved by the organic solvent, the resin used to bond the compound semiconductor layer to the surface film is also exposed to the organic solvent at the same time. Thus, there is a problem that, when the resin is exposed to the organic solvent and water, the exposed resin penetrates into the interface between the surface film and the resin, or into the interface between the compound semiconductor layer and the resin, so as to make the surface film liable to be separated from the compound semiconductor layer.

Further, the process for removing the substrate by the etchant is performed after a metallic ribbon for establishing electrical connection is welded to the solar cell element. As the etchant for etching the substrate, it is necessary to use hydrofluoric acid, and the like, depending on the substrate material. However, hydrofluoric acid reacts with the metallic ribbon to corrode the metallic ribbon. At the time of etching the substrate, the exposed metallic ribbon is required to be protected by being covered with an acid resistant material. This results in a problem that the number of processes is increased.

Here, a method for manufacturing the compound solar cell described in Patent Document 1 includes: forming the rear surface electrode on the cell main body; attaching a support plate on the rear surface electrode; separating the substrate from the cell main body to expose the surface of the cell main body; forming the surface electrode on the exposed surface of the cell main body; and then removing the support plate.

In the compound solar cell described in Patent Document 1, the rear surface electrode is formed first. For this reason, after the rear surface electrode is annealed, the surface film can be bonded. However, in the above-described compound solar cell described in Patent Document, the surface film as the base material is not provided, and hence the problem of separation of the surface film does not occur.

PRIOR ART DOCUMENTS

Patent Document

Patent Document 1: Japanese Patent Laid-Open No. 2004-327889

SUMMARY

Technical Problem

The structure of the solar-battery cell described in Patent Document 1 has a problem that, since the structure is configured only by the semiconductor epitaxial layer and the rear surface electrode, the epitaxial layer is easily broken when an external force due to bending, or the like, is applied to the structure. Further, in the structure configured only by the semiconductor epitaxial layer and the rear surface electrode, the warpage of the solar-battery cell cannot be controlled.

Thus, in view of the above, an object of the present invention is to provide a method for manufacturing a thin film compound solar cell which can improve the adhesive property of the electrode even when provided with the base material and which can withstand the external force without the separation of the base material.

Means for Solving the Problems

The present invention provides a method for manufacturing a thin film compound solar cell having a cell main body in which at least one PN junction is formed by a plurality of compound semiconductor layers, each having a different chemical composition, the method including: a process of forming a cell main body by forming an etching-stop layer for suppressing infiltration of an etching solution from the side of a substrate, a contact layer, an emitter layer made of a first conductivity type compound semiconductor, a base layer forming a PN junction with the emitter layer, and a buffer layer; a process of forming a rear surface electrode on the cell main body; a process of annealing the rear surface electrode; a process of forming a base material on the rear surface electrode; a process of attaching a reinforcing material on the base material; a process of separating the substrate from the cell main body; a process of forming a surface electrode on the exposed surface of the separated cell main body; a process of separating the reinforcing material; and a process of sintering the surface electrode. Further, the method for manufacturing the thin film compound solar cell includes a process of, after the annealing of the surface electrode, separating the thin film compound solar cell into a plurality of solar cell elements, and a process of connecting a metallic ribbon to each of the electrodes.

The rear surface electrode is formed in the early stage, and thereby the rear surface electrode can be annealed, so that it is possible to improve the adhesive property of the electrode and to reduce the contact resistance of the electrode. Further, a metallic ribbon is finally connected, and thereby it is possible to eliminate the unnecessary protection for the metallic ribbon.

In the method for manufacturing the thin film compound solar cell, the cell main body includes an etching-stop layer and a contact layer respectively laminated on the side of the substrate. Also, the method for manufacturing the thin film compound solar cell includes a process of, after the separation of the substrate, removing the etching-stop layer from the cell main body, a process of etching the contact layer into a predetermined pattern, and a process of mesa-etching the cell main body, and forms the surface electrode on the mesa-etched contact layer.

Alternatively, the method for manufacturing the thin film compound solar cell includes a process of, after the separation of the substrate, removing the etching-stop layer from the cell main body, a process of mesa-etching the cell main body, and a process of, after the surface electrode is formed on the contact layer, etching the contact layer. In this case, the surface electrode functions as an etching mask.

The base material is made of a material having heat resistance capable of withstanding a temperature higher than the annealing temperature of the surface electrode and is made of, for example, a film-like polyimide. The polyimide film is formed by applying and annealing a resinous polyimide. Alternatively, the polyimide film is formed by applying and annealing a solution of polyamic acid which is a polyimide precursor. Further, the thickness of the polyimide film is set to 15 μm or less.

Here, it is technically impossible to bond the polyimide film onto the rear surface electrode by using an adhesive, because of the problem of the heat-resistance of the adhesive itself. Thus, when the base material is formed by the above-described method, the surface electrode can be sintered after the formation of the base material.

With the above-described manufacturing method, a thin film compound solar cell is manufactured, which includes: a compound semiconductor layer with at least one PN junction formed therein; a surface electrode formed on one surface of the compound semiconductor layer; a polyimide film formed on the other surface of the compound semiconductor layer; and a rear surface electrode sandwiched between the compound semiconductor layer and the polyimide film. Note that the compound semiconductor layer is made of an epitaxially grown single crystal thin film.

Effects of the Invention

According to the present invention, since the surface electrode and the rear surface electrode are annealed, it is possible to improve the adhesive property of each of the electrodes and to reduce the contact resistance of each of the electrodes. Further, the heat-resistant base material is used. Thus, after the reinforcing material is removed, the electrode can be annealed in the state where the base material is attached. As a result, the reinforcing material is not heat-treated, and hence the reinforcing material can be reused.

Further, a highly heat-resistant film, such as polyimide, is used as the base material, and hence the film itself serves as the supporting body. Therefore, even when an external force is applied, the photovoltaic cell is not broken. Further, since the amount of warpage of the photovoltaic cell is changed according to the film thickness, it is possible to control the warpage of the cell during the film forming process.

BRIEF DESCRIPTION OF DRAWINGS

FIG. 15 is a cross-sectional view of the thin film compound solar cell when a third protective film formed.

EXPLANATION OF REFERENCES 1 substrate
2 etching-stop layer
3 contact layer
4 emitter layer
5 base layer
6 buffer layer
7 rear surface electrode
8 rear surface film
9 reinforcing material
10 first protective film
11 second protective film
12 third protective film
13 surface electrode

MODES FOR CARRYING OUT THE INVENTION

A thin film compound solar cell according to the present embodiment has a structure including: a cell main body in which at least one PN junction is formed by laminating a plurality of compound semiconductor layers, each having a different chemical composition; a surface electrode which is formed on the light receiving surface of the cell main body; a rear surface electrode which is formed on the opposite surface of the cell main body; and a base material for the thin film solar cell. The base material is formed on the opposite surface of the cell main body, and the rear surface electrode is sandwiched between the cell main body and the base material.

A method for manufacturing the solar cell having this structure will be described. In process 1 shown in FIG. 1, a compound semiconductor layer made of single crystal thin films is formed by laminating, on a substrate 1, an etching-stop layer 2 for suppressing infiltration of an etching solution from the side of the substrate, a contact layer 3, an emitter layer 4 made of a first compound semiconductor, a base layer 5 forming a PN junction with the emitter layer 4, and a buffer layer 6 in this order. The substrate 1 has, for example, a wafer-like form, and a cell main body is formed by laminating, on the substrate 1, compound semiconductor layers, such as the etching-stop layer 2, the contact layer 3, the emitter layer 4, the base layer 5, and the buffer layer 6, by a known process, for example, the epitaxial growth method described in Patent Document 1.

Figure 1:
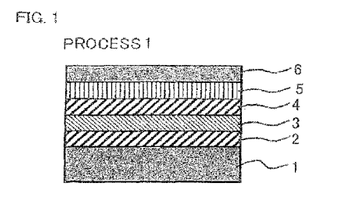
FIG. 1 is a cross-sectional view of a thin film compound solar cell according to the present invention when a cell main body made of a plurality of compound semiconductor layers is formed.

As the substrate 1, it is possible to use a wafer made of a material, such as Ge, GaP, and GaAs. As the compound semiconductor layers, for example, the etching-stop layer 2 such as an InGaP layer, the contact layer 3 such as an AlInP layer, the emitter layer 4 such as an N-type InGaP layer, the base layer 5 such as a P-type InGaP layer, and the buffer layer 6 such as an AlInP layer are used.

Note that the cell main body is assumed to have the 5 layer structure, but the layer structure of the cell main body is not limited to this. The cell main body may have, for example, a four layer structure, a six layer structure, or the like. Further, other than the etching-stop layer 2, the contact layer 3, the emitter layer 4, the base layer 5, and the buffer layer 6, the cell main body may include compound semiconductor layers, such as a BSF (back surface field) layer, a window layer, a tunnel junction layer of a multi junction type solar cell, and the other emitter layer and the other base layer of the multi junction type solar cell.

That is, it is only necessary that the cell main body formed on the substrate 1 is made of a plurality of compound semiconductor layers, each having a different chemical composition, and that at least one PN junction is formed by the plurality of compound semiconductor layers. Further, it is only necessary that the plurality of compound semiconductor layers include at least a layer which is easily etched by a second etching solution for etching the contact layer and which is hardly etched by a third etching solution for mesa-etching, and a layer which is hardly etched by the second etching solution and which is easily etched by the third etching solution. The former layer is the contact layer 3, and the latter layers are the emitter layer 4 and the base layer 5.

Figure 2:
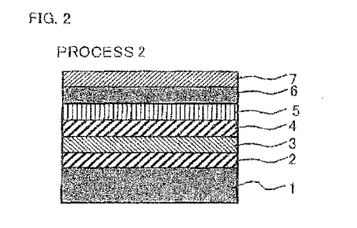
FIG. 2 is a cross-sectional view of the thin film compound solar cell when a rear surface electrode is formed.

In process 2 shown in FIG. 2, a rear surface electrode 7 is formed on the surface of the buffer layer 6 which is the outermost surface of the compound semiconductor layers (the etching-stop layer 2, the contact layer 3, the emitter layer 4, the base layer 5, and the buffer layer 6) laminated onto each other. The rear surface electrode 7 is formed all over the compound semiconductor layer. The rear surface electrode 7 is formed by a method in which a metal paste made of Al, Ag, or the like, is applied to the outermost surface of the cell main body by screen printing. After the formation of the rear surface electrode 7, the cell main body is subjected to heat treatment, so that the rear surface electrode 7 is annealed. Therefore, the contact resistance between the surface of the compound semiconductor layer and the rear surface electrode 7 can be reduced, and the adhesive force between the surface of the compound semiconductor layer and the rear surface electrode 7 can be increased.

Figure 3:
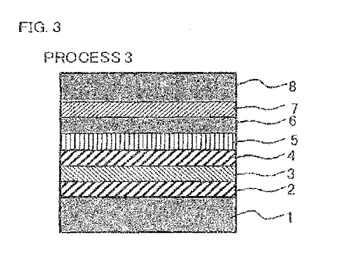
FIG. 3 is a cross-sectional view of the thin film compound solar cell when a rear surface film is formed.

In process 3 shown in FIG. 3, after the formation of the rear surface electrode 7, a highly heat-resistant rear surface film 8 is formed on the rear surface electrode 7. The rear surface film 8 is made of a material having heat resistance capable of withstanding a temperature of 300° C. or more, and, for example, polyimide is used as the material of the rear surface film 8. The method for forming the rear surface film 8 includes a method in which a varnish-like resin is applied on the rear surface electrode 7 at a normal temperature by a spin-coating method, or the like, and then annealed.

When the rear surface film 8 is formed by applying and annealing a varnish of polyimide, it is necessary to control the film thickness of polyimide. This is because, when the film thickness of polyimide is 20 μm or more, air bubbles are mixed into the polyimide film, so as to prevent a flat film from being annealed, and because the amount of warpage of the polyimide film is also large, so as to damage the cell main body. When the film thickness of polyimide is reduced, the mixing of air bubbles is prevented in the thickness range of 20 μm or less, and the warpage of the polyimide film is also reduced. When the film thickness of polyimide is about 7 μm, the amount of warpage of the polyimide film is minimized. When the film thickness of polyimide is less than about 7 μm, the direction of warpage is reversed, and the amount of warpage is again increased. Therefore, as a result of consideration of the warpage amount of polyimide, and of the elasticity of polyimide as the base material of the cell main body, the film thickness of polyimide in the range of 5 to 15 μm is suitable for the production of the cell main body, and in particular the film thickness of about 7 μm is optimum. Note that, in the above, the method, in which the film is formed by annealing the varnish-like polyimide, is exemplified. However, besides this method, there is a method in which a thermal fusion adhesive film is used and press-fitted to the rear surface electrode 7 while being heated. Thereby, the rear surface film 8 is formed as the base material of the thin film solar cell so as to serve as the supporting body. Further, when the film thickness of the rear surface film is set to 15 μm or less, the base material with a less warpage amount can be formed, so that the warpage of the cell main body is controlled to reduce the warpage of the cell main body.

Figure 4:
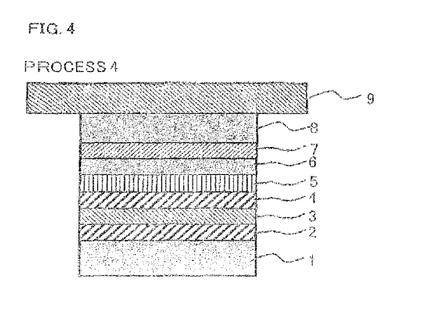
FIG. 4 is a cross-sectional view of the thin film compound solar cell when a reinforcing material is attached.

In process 4 shown in FIG. 4, after the formation of the rear surface film 8, a reinforcing material 9 for reinforcing the compound semiconductor layer is bonded onto the rear surface film 8. As the reinforcing material 9, it is preferred to use a PET film, and the like, with an adhesive material whose adhesive force is lowered by irradiation of UV light. Thereby, the reinforcing material 9 can be directly attached to the rear surface film 8.

Figure 5:
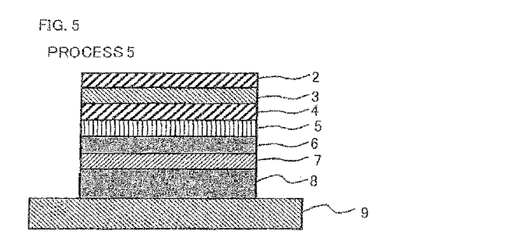
FIG. 5 is a cross-sectional view of the thin film compound solar cell when a substrate is removed.

In process 5 shown in FIG. 5, after the bonding of the reinforcing material 9, the substrate 1 is etched and removed by using a first etching solution. As the first etching solution, a proper solution is selectively used according to the material of the substrate. In the case where the substrate is made of Ge, it is preferred to use a solution having a composition of hydrofluoric acid:aqueous hydrogen peroxide:water=1:1:4. The etching-stop layer 2 is a layer which is hardly etched by the first etching solution. Thus, when the substrate is etched so that the etching-stop layer 2 is exposed, the progress of etching is stopped. Thereby, only the substrate 1 can be separated so that only the compound semiconductor layer is left.

Figure 6:
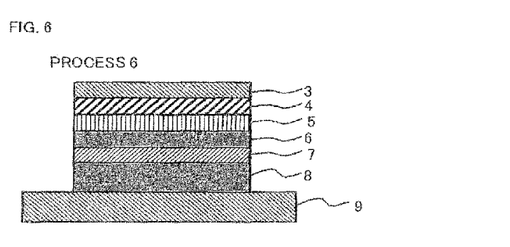
FIG. 6 is a cross-sectional view of the thin film compound solar cell when an etching-stop layer is removed.

In process 6 shown in FIG. 6, after the etching of the substrate, the etching-stop layer 2 is removed by being etched by the second etching solution. The contact layer 3 is exposed at the outermost surface.

Figure 7:
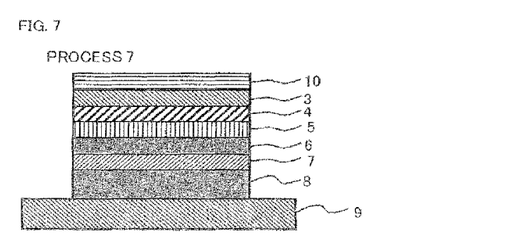
FIG. 7 is a cross-sectional view of the thin film compound solar cell when a first protective film is formed.

In process 7 shown in FIG. 7, a first protective film 10 is applied and formed on the contact layer 3 in order to protect the outermost surface of the cell main body from the chemical treatment (contact layer etching). The protective film 10 has resistance against the second etching solution used to etch the compound semiconductor layer in the subsequent process. When a photoresist is used as the protective film 10, the processing is easily and surely performed.

Figure 8:
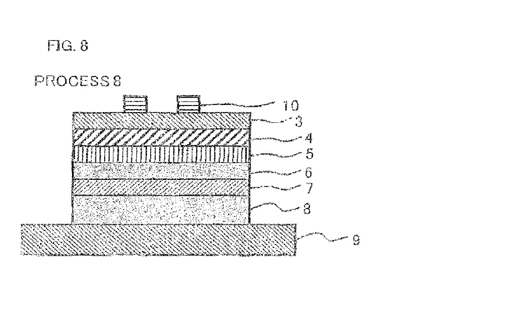
FIG. 8 is a cross-sectional view of the thin film compound solar cell when the protective film is patterned.

In process 8 shown in FIG. 8, after the formation of the protective film 10, the patterning of the protective film 10 for forming a surface electrode is performed by using a glass mask, so that an opening section is formed in the protective film 10. The protective film 10 serves as an etching mask when the contact layer is etched in the subsequent process.

Figure 9:
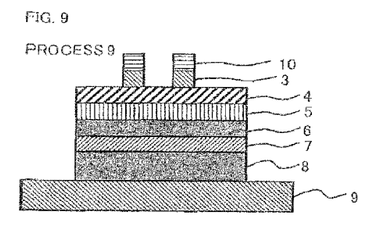
FIG. 9 is a cross-sectional view of the thin film compound solar cell when a contact layer is etched.

In process 9 shown in FIG. 9, after the protective film 10 is patterned, the contact layer is etched. The cell main body is immersed in the second etching solution capable of etching the compound semiconductor layer, so that the contact layer 3 is etched by using the patterned protective film 10 as an etching mask. An alkali solution is used as the second etching solution. A part of the emitter layer 4 is exposed at the outermost surface.

Figure 10:
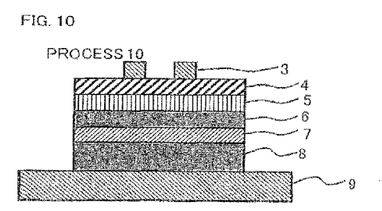
FIG. 10 is a cross-sectional view of the thin film compound solar cell when the protective film is separated.

In process 10 shown in FIG. 10, after the etching of the contact layer 3, the protective film 10 used as the etching mask for etching the contact layer is separated.

Figure 11:
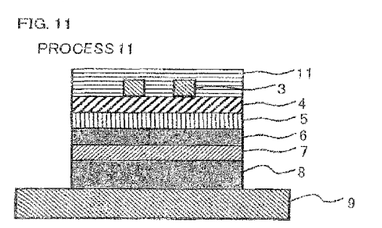
FIG. 11 is a cross-sectional view of the thin film compound solar cell when a second protective film is formed.

In process 11 shown in FIG. 11, a second protective film 11 is applied and formed in order to protect the outermost surface of the cell main body from mesa-etching. A photoresist is used as the second protective film 11.

Figure 12:
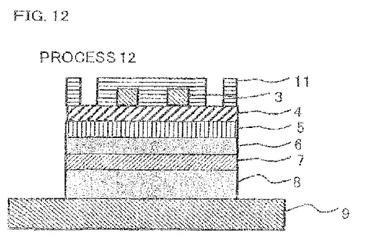
FIG. 12 is a cross-sectional view of the thin film compound solar cell when the protective film is patterned.

In process 12 shown in FIG. 12, after the formation of the protective film 11, an opening section for defining the region of a solar cell element is formed in the protective film 11 by patterning the protective film 11 by using a glass mask. The protective film 11 serves as an etching mask at the time of mesa-etching in the subsequent process.

Figure 13:
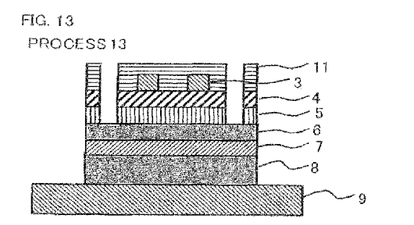
FIG. 13 is a cross-sectional view of the thin film compound solar cell at the time of mesa-etching.

In process 13 shown in FIG. 13, after the patterning of the protective film 11, the cell main body is immersed in the third etching solution capable of etching the compound semiconductor layer, so that the cell main body is mesa-etched by using the patterned protective film 11 as an etching mask. The emitter layer 4 and the base layer 5 are etched along the patterned protective film 11. An alkali solution and an acid solution are used as the third etching solution. The region of the solar cell element can be defined by the mesa-etching.

Figure 14:
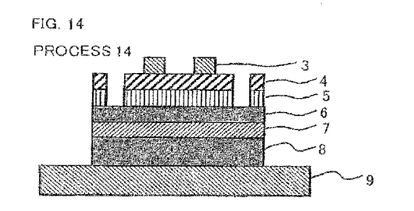
FIG. 14 is a cross-sectional view of the thin film compound solar cell when the protective film is separated.

In process 14 shown in FIG. 14, after the mesa-etching, the protective film 11 used as the etching mask is separated.

In process 15 shown in FIG. 15, a third protective film 12 made of a photoresist is applied and formed on the whole outer surface of the etched cell main body in order to perform the patterning of the surface electrode.

Figure 16:
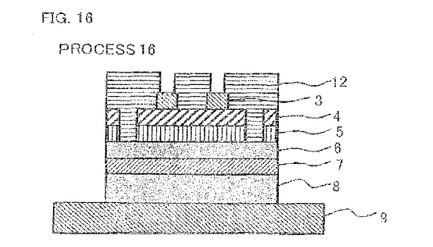
FIG. 16 is a cross-sectional view of the thin film compound solar cell at the time of patterning for forming a surface electrode.

In process 16 shown in FIG. 16, after the formation of the protective film 12, the protective film 12 is patterned by using a glass mask, and thereby an opening section is formed in the protective film 12 so that the patterning of the surface electrode can be performed. At this time, the patterning of the protective film 12 is performed so that the opening section is formed on the contact layer 3 patterned by the preceding process.

Figure 17:
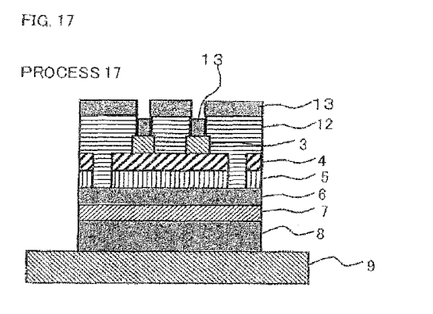
FIG. 17 is a cross-sectional view of the thin film compound solar cell when the surface electrode is formed.

In process 17 shown in FIG. 17, after the patterning of the protective film 12, the cell main body, to which the reinforcing material 9 is attached, is set in an electrode forming apparatus. A surface electrode 13 is formed on the protective film 12 and in the opening section of the protective film 12. The surface electrode 13 is formed by applying an electrode material, such as Al or Ag, to the outermost surface of the cell main body by screen printing, or by vapor-depositing the electrode material on the outermost surface.

Figure 18:
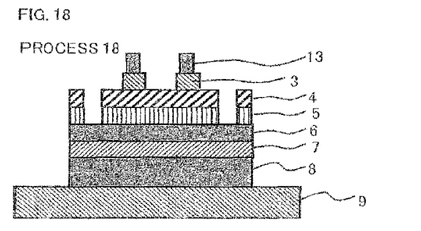
FIG. 18 is a cross-sectional view of the thin film compound solar cell when the protective film is removed.

In process 18 shown in FIG. 18, the cell main body, on which the electrode material laminated, is immersed in an organic solvent, such as acetone. The photoresist, which is the protective film 12, is dissolved in the organic solvent, so that the electrode material attached on the photoresist is removed together with the photoresist. The electrode material is selectively attached only in the opening section, and thereby the surface electrode 13 is formed on the contact layer 3, so that the thin film compound semiconductor solar cell is formed.

Figure 19:
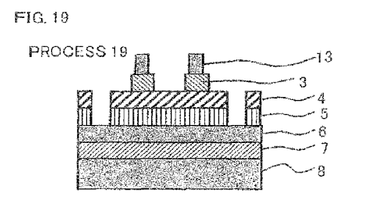
FIG. 19 is a cross-sectional view of the thin film compound solar cell when the reinforcing material is separated.

In process 19 shown in FIG. 19, after the formation of the surface electrode 13, the thin film compound semiconductor solar cell is separated from the reinforcing material 9. As the separation method, when the UV separation type material is used as the adhesive material, a method is used, in which the reinforcing material 9 is separated from the cell main body by irradiating UV light by using a UV irradiation apparatus.

Figure 20:
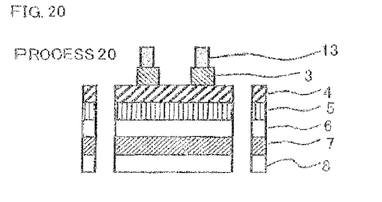
FIG. 20 is a cross-sectional view of the thin film compound semiconductor solar cell when the cell is divided into solar cell elements.

In process 20 shown in FIG. 20, after the separation of the reinforcing material 9, the surface electrode 13 is annealed. By performing the heat treatment, it is possible to reduce the contact resistance between the contact layer 3 and the surface electrode 13, and to improve the adhesive property between the contact layer 3 and the surface electrode 13. Next, the thin film compound solar cell formed in the wafer is separated into a plurality of solar cell elements. As the separation method, a method is used, in which the thin film compound solar cell is fixed to a stage by vacuum suction, or the like, and in which the opening section formed by the mesa-etching is cut by a scriber so that the plurality of solar cell elements are formed.

Finally, a metallic ribbon made of Ag, or the like, for establishing electrical connection between the respective elements, is connected by welding, or the like, to an electrode pad on the electrode of each of the solar cell elements.

In the thin film compound solar cell manufactured by the manufacturing method as described above, the reinforcing material 9 is directly bonded to the rear surface film 8 as the base material without using an adhesive, such as wax. Thereby, a solvent for separating the reinforcing material 9 need not be used, so that it is possible to prevent the problem that the rear surface film 8 is separated by the solvent. The rear surface film 8 has heat resistance capable of withstanding a temperature higher than the annealing temperature of the surface electrode 13, and hence it is possible to anneal the surface electrode 13 after the rear surface film 8 is formed on the rear surface electrode 7.

When the surface electrode 13 and the rear surface electrode 7 are annealed, the adhesive property of the electrodes with the cell main body is improved, so as to prevent each of the electrodes from being separated. Further, the contact resistance between the electrodes and the compound semiconductor layer can be reduced, so that the conversion efficiency is increased.

Further, the structure, in which the surface electrode 13 is not covered with a surface film, is adopted, and hence the surface electrode 13 is exposed. Thus, after the substrate 1 is removed, the metallic ribbon can be connected, and hence it is not necessary that, as in the conventional case, the metallic ribbon is protected when the substrate is removed. As a result, the number of processes can be reduced.

Further, a highly heat-resistant film, such as polyimide, is used as the base material, and thereby the film itself serves as a supporting body. Therefore, even when an external force is applied, the photovoltaic cell is prevented from being broken. Further, since the amount of warpage of the photovoltaic cell is changed according to the thickness of the film, the warpage of the cell can be reduced in such a manner that, when the film is formed, the thickness of the film is adjusted over the whole cell according to the thickness of the cell.

Figure 21:
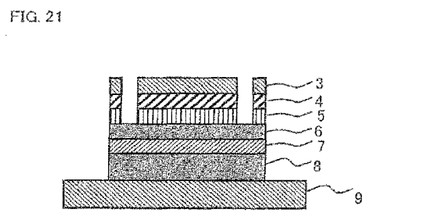
FIG. 21 is a cross-sectional view of a thin film compound solar cell when mesa-etching is performed before the contact layer etching in another manufacturing method.
Figure 22:
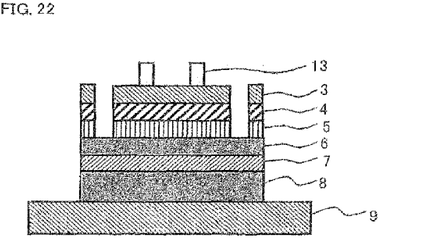
FIG. 22 is a cross-sectional view of the thin film compound solar cell when the surface electrode is formed in another manufacturing method.

Note that the present invention is not limited to the above described embodiment, but numerous modifications and changes can be obviously made therein without departing from the spirit and scope of the present invention. In another method for manufacturing a thin film compound solar cell, after process 4 described above, the substrate 1 is separated from the cell main body, and the etching-stop layer 2 is removed. Then, the cell main body is mesa-etched as shown in FIG. 21. A protective film made of a photoresist is formed on the contact layer 3, and the patterning for forming the surface electrode is performed. An electrode material is laminated on the protective film and on the contact layer 3 in the opening section. When the protective film is removed, the surface electrode 13 is formed as shown in FIG. 22.

Figure 23:
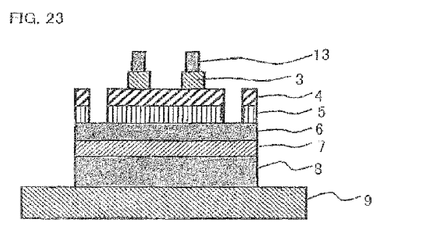
FIG. 23 is a cross-sectional view of the thin film compound solar cell when the contact layer is etched in another manufacturing method.

Thereafter, as shown in FIG. 23, the contact layer 3 is etched by the contact layer etching. At this time, the surface electrode 13 is used as an etching mask. Subsequently, the reinforcing material 9 is separated from the cell main body, and the surface electrode 13 is annealed. Then, the thin film compound solar cell is separated into a plurality of solar cell elements, and the metallic ribbon is finally connected to each of the solar cell elements.

With this manufacturing method, the surface electrode 13 serves as a protective film in the contact layer etching. Thus, as compared with the above-described manufacturing method, the process of forming the protective film used to perform the contact layer etching can be eliminated, and hence the number of processes can be reduced.

Further, in another method for manufacturing the rear surface film which is the base material, the rear surface film is formed by applying and sintering a solution of polyamic acid which is a polyimide precursor. That is, a solution of varnish-like polyamic acid is applied on the rear surface electrode, and is annealed stepwise so that a polyimide film is formed.

Specifically, the polyamic acid solution is applied on the rear surface electrode by a spin-coating method, or the like. Thereafter, when annealing is first performed at 120° C. for one hour, the solvent of polyamic acid is evaporated, and the solution is temporarily cured. Then, the annealing temperature is increased stepwise. Finally, the annealing temperature is increased to the temperature at which the polyamic acid is polymerized and changed to a polyimide film. By this main curing, the polyimide film is formed.

The reason for performing the annealing stepwise in this way is that, when the annealing is performed from the beginning at a temperature at which the polyamic acid starts to be polymerized, the surface layer of the polyamic acid solution is cured prior to the curing in the inside of the polyamic acid solution, with the result that an air bubble included in the solution at the time of annealing is left in the inside of the polyamic acid solution, and that the air bubble left in the inside of the polyamic acid solution is expanded to form a portion at which the rear surface electrode is not in close contact with the polyimide film. In addition, when the polyamic acid solution is rapidly cured, the contraction degree of the surface layer portion of the formed polyimide film becomes larger than the contraction degree in the inside of the polyimide film, so that the amount of warpage of the polyimide film is increased and thereby the photovoltaic cell is greatly warped. Thus, when the annealing temperature is increased stepwise as described above, the air bubble is prevented from being generated in the inside of the polyamic acid solution and the difference in the contraction degree between the surface layer portion and the inside of the polyimide film can also be prevented from occurring.

What is claimed is:

1. A method for manufacturing a thin film compound solar cell having a cell having a compound semiconductor layer in which at least one PN junction is formed, the method comprising:
   a process of forming a compound semiconductor layer comprising at least one PN junction on a side of a substrate;
   a process of forming a rear surface electrode on a surface of the compound semiconductor layer;
   a process of forming a base material made of a polyimide film by applying, annealing and curing polyimide directly on the rear surface electrode;
   a process of attaching a reinforcing material directly to the base material, wherein the reinforcing material comprises an adhesive material;
   a process of separating the substrate from the compound semiconductor layer;
   a process of forming a surface electrode; and
   a process of removing the reinforcing material from the base material,
   wherein a thickness of the polyimide film is set between 5 µm and 15 µm.

2. The method for manufacturing a thin film compound solar cell according to claim 1, in which a process of annealing the surface electrode is included.

3. The method for manufacturing a thin film compound solar cell according to claim 1, in which a process of annealing the rear surface electrode is included.

4. The method for manufacturing a thin film compound solar cell according to claim 1, wherein
   the polyimide film is formed by applying and annealing stepwise a solution of polyamic acid.

5. A method for manufacturing a thin film compound solar cell having a cell having a compound semiconductor layer in which at least one PN junction is formed, the method comprising:
   a process of forming a compound semiconductor layer comprising at least one PN junction on a side of a substrate;
   a process of forming a rear surface electrode on a surface of the compound semiconductor layer;
   a process of forming a base material made of a polyimide film by applying, annealing and curing polyimide directly on the rear surface electrode;
   a process of attaching a reinforcing material directly to the base material, wherein the reinforcing material is a film, with an adhesive material whose adhesive force is lowered by irradiation of UV light;
   a process of separating the substrate from the compound semiconductor layer;
   a process of forming a surface electrode; and
   a process of separating the reinforcing material from the base material by irradiating UV light,
   wherein a thickness of the polyimide film is set between 5 µm and 15 µm.

* * * * *